United States Patent [19]

Kato

[11] Patent Number: 4,703,234
[45] Date of Patent: Oct. 27, 1987

[54] CHARGED-PARTICLE ACCELERATOR
[75] Inventor: Shoji Kato, Tokyo, Japan
[73] Assignee: Jeol Ltd., Tokyo, Japan
[21] Appl. No.: 714,613
[22] Filed: Mar. 21, 1985
[30] Foreign Application Priority Data Mar. 30, 1984 [JP] Japan .................................. 59-62672

[51] Int. Cl.[4] .......................................... H01J 25/10
[52] U.S. Cl. .................... 315/5.41; 174/9 R; 174/13; 174/17 CT; 174/17 GF; 250/311; 439/184; 439/198
[58] Field of Search ...................... 315/5.41; 250/311; 174/8, 10, 11 BH, 13, 15 BH, 15 C, 17 GF, 17 CT, 21 JS, 25 G, 28, 30; 339/24, 46, 48, 75 A, 82, 92 R, 94, 103 R, 111, 117 R, 117 P

[56] References Cited
U.S. PATENT DOCUMENTS

| | | | |
|---|---|---|---|
| 615,896 | 12/1898 | Poche | 174/9 R |
| 2,396,871 | 3/1946 | Meyerhans | 174/17 CT X |
| 2,857,557 | 10/1958 | Imhof | 339/117 R |
| 3,009,983 | 11/1961 | Oppel | 174/12 BH X |
| 3,384,861 | 5/1968 | Phillips | 339/111 |
| 3,671,742 | 6/1972 | Browning | 250/311 |
| 3,938,001 | 2/1976 | Ota et al. | 315/381 |
| 3,968,373 | 7/1976 | Reifenschweiler | 339/111 X |
| 4,038,486 | 7/1977 | Meyer et al. | 174/13 X |
| 4,131,329 | 12/1978 | Flatt | 339/111 |
| 4,160,905 | 7/1979 | Davey | 250/311 |
| 4,204,084 | 5/1980 | Mastroinni et al. | 174/176 F X |

FOREIGN PATENT DOCUMENTS 2443756 8/1980 France .................................. 174/13

Primary Examiner—Larry Jones
Attorney, Agent, or Firm—Webb, Burden, Robinson & Webb

[57] ABSTRACT

With an accelerator for accelerating an electron beam by a voltage of about 400 KV having a stability of $10^{-6}$, it is difficult to use a flexible, insulated cable to feed the output from a power supply to an electron beam and an accelerating tube. Accordingly, the present invention employs a rodlike connector instead of such an insulated cable. A guide means is provided to permit the movement of a power supply column in the direction of the axis of the connector. This facilitates cleaning or otherwise maintaining the power supply column, the electron gun, and the accelerating tube.

2 Claims, 4 Drawing Figures

CHARGED-PARTICLE ACCELERATOR

BACKGROUND OF THE INVENTION

The present invention relates to an easily maintained charged-particle accelerator.

In an electron microscope, the electron beam produced by the electron gun may be required to be accelerated with a high voltage, depending upon the purpose of the observation. In addition, the accelerating voltage is required to be kept at a stability of the order of $10^{-6}$. These requirements necessarily make the high voltage power supply bulky.

FIG. 1 schematically shows the circuit configuration of the portion of a conventional, relatively high voltage electron microscope which relates to the acceleration of electron beam. In this figure, surrounded by dot-and-dash line 1 is a high voltage circuit consisting of a voltage-multiplying and rectifying circuit 2, such as a Cockroft-Walton generator. The output from the circuit 2 is supplied to a DC circuit 5 which includes a filtering circuit 4 for filtering out ripple, an output detector circuit (not shown); and an AC power supply 3 for heating a cathode 9. The output from the DC circuit 5 is fed to a control electrode 7 and to the cathode 9 in an electron gun 8 via a balancing resistor $r_1$ and a bias reactor $r_2$ through an insulated cable 6. The high voltage circuit 1 and the DC circuit 5 are enclosed in a housing 19, known as a power supply column. This housing is filled with an electrically insulating gas such as Freon ($CCl_2F_2$) or sulfur hexafluoride ($SF_6$). The output from the AC power supply 3 is fed to the cathode 9 in the electron gun 8 through the cable 6. The high voltage from the DC circuit 5 is applied across the terminals of the cathode 9. Voltage-dividing resistors 10 are inserted between the control electrode 7 and the ground. Voltages which are obtained by stepping down the high voltage are applied across a series of accelerating electrodes 11. An accelerating tube is indicated by dot-and-dash line 12. The accelerating electrodes 11 of the accelerating tube 12 and the cathode 9 and the control electrode 7 of the electron gun 8 are enclosed in an evacuated microscope column, indicated by dot-and-dash line 14. The members of the electron gun 8 and the accelerating tube 12 which are outside the microscope column 14 are housed in an electron gun and accelerating tube column 13 that is filled with an insulating gas. A structure of this kind is disclosed in U.S. Pat. No. 3,938,001.

In the prior art structure shown in FIG. 1, the electron gun and accelerating tube column 13 are connected via the insulated cable 6 to the housing 19 that houses the high voltage circuit 1 and the DC circuit 5. As the accelerating voltage is increased, it becomes more difficult to impart flexibility to the cable 6. Where it is a high voltage approximately equal to, or exceeding, 500 KV, the housing 19 and the column 13 must be fabricated as a unit without the use of such a cable. Thus, as described in U.S. Pat. No. 4,160,905, it follows that a power supply column, an electron gun and accelerating tube column, etc. are all enclosed in a single large, sealed housing. Unfortunately, it is difficult to separate this apparatus into several parts for transportation. When a portion of the power supply column is repaired, or when the electron gun or the accelerating tube is cleaned, the insulating gas is required to be fully discharged from the large column before the cover for the column is removed. In this way, the apparatus is uneconomical and cumbersome to maintain.

SUMMARY OF THE INVENTION

It is the main object of the present invention to provide a charged-particle accelerator having an electron gun, an accelerating tube, and power supply all of which can be easily maintained.

It is another object of the invention to provide a charged-particle accelerator in which a first column that houses an electron gun and an accelerating tube is physically separate from a second column that houses their power supply, but in which the first column is electrically connected with the second column without the use of a flexible insulated cable.

These and additional objects of the invention are achieved by a charged-particle accelerator comprising: a power supply circuit including a voltage-multiplying and rectifying circuit and a filtering circuit for filtering out the AC component contained in the output from the voltage-multiplying and rectifying circuit; a charged-particle source having electrodes to which the output from the power supply circuit is applied; an accelerating tube having electrodes and acting to accelerate the particle beam emitted from the charged-particle source; an evacuated microscope column that houses the electrodes of the source and the electrodes of the accelerating tube; a hermetically sealed power supply column which houses the power supply circuit and which is filled with an insulating gas; a hermetically sealed charged-particle source and accelerating tube column disposed independent of the power supply column and filled with an insulating gas, the charged-particle source and accelerating tube column covering a portion of the microscope column in a sealable manner; a rodlike connector whose both ends are detachably connected to the connector portions of the power supply column and of the electron gun and accelerating tube column; and a guide means for permitting the movement of the power supply column along the axis of the connector when the power supply column is connected to the charged-particle source and accelerating tube column by the connector.

PREFERRED EMBODIMENT OF THE INVENTION

Figure 1:
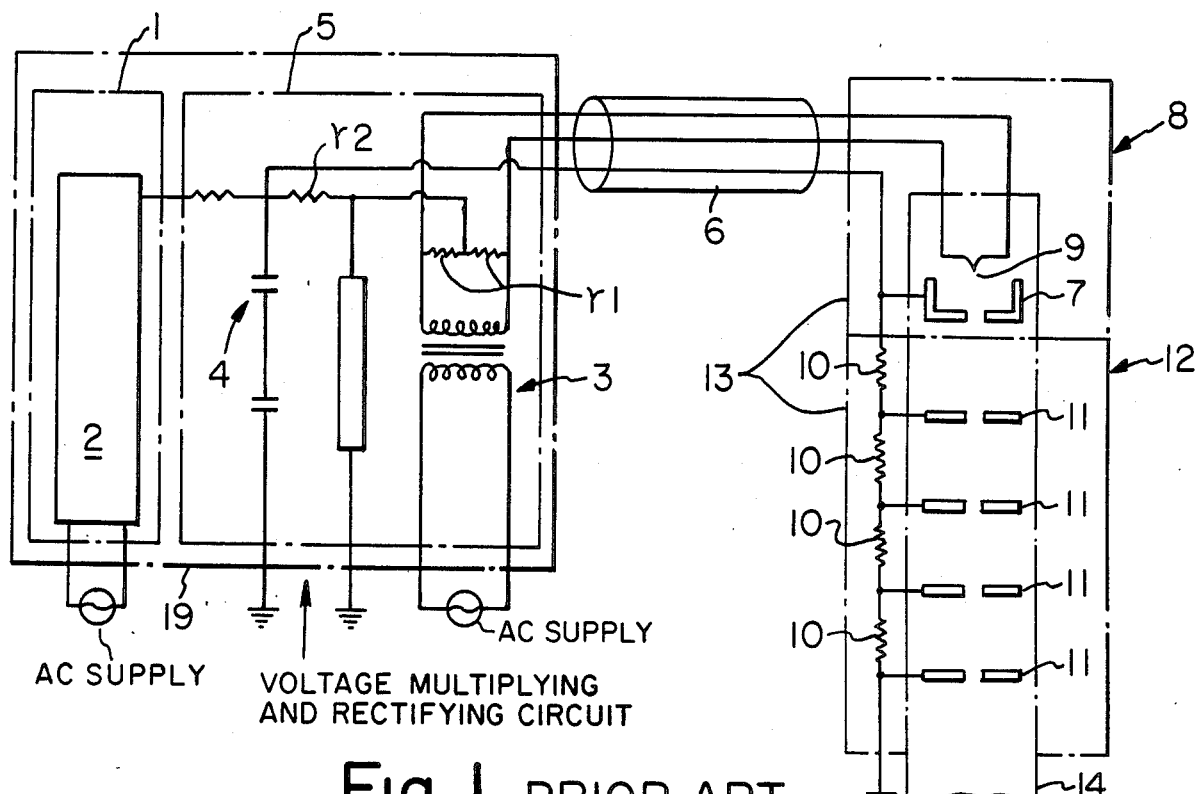
FIG. 1 is a schematic circuit diagram of the portion of a prior art electron microscope which relates to the acceleration of electron beam.
Figure 2:
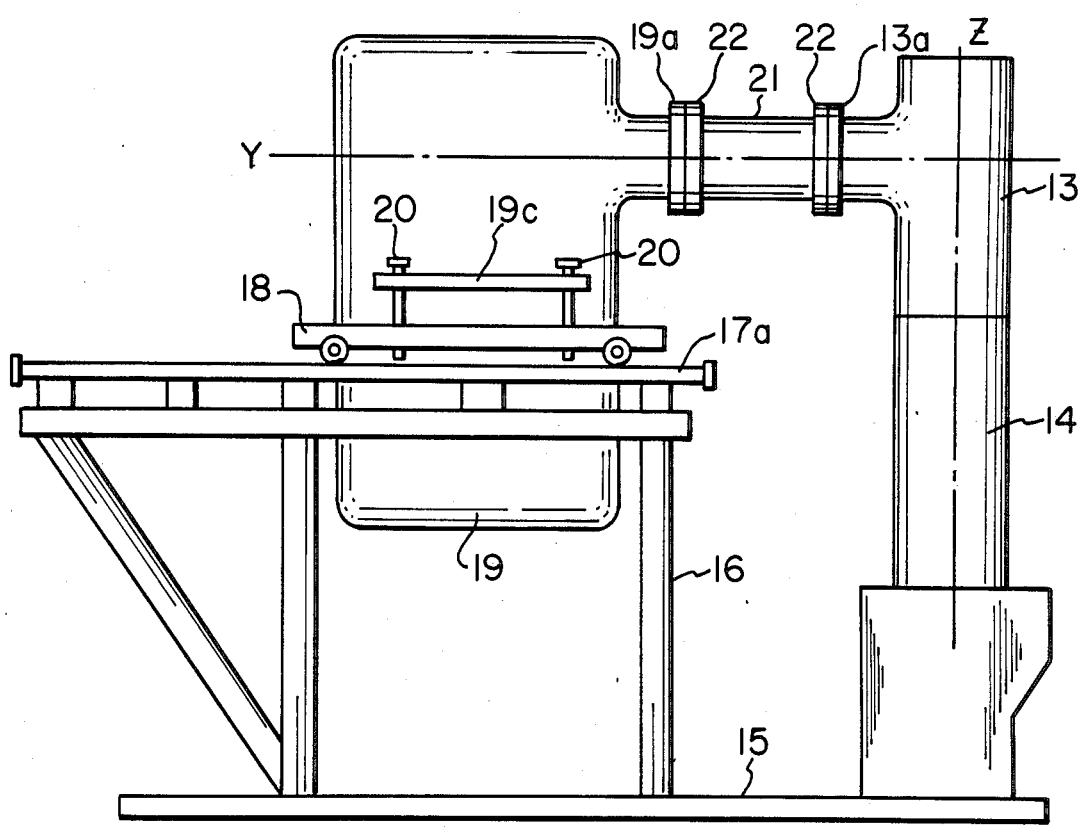
FIG. 2 is a front elevation of a charged-particle accelerator according to the present invention.

Referring to FIG. 2, there is shown the appearance of an electron microscope embodying the concept of the present invention. This microscope has an evacuated microscope column 14. An electron gun and accelerating column 13 as described previously in connection with FIG. 1 is mounted on the microscope column 14, which is installed on a base 15. Two parallel rails 17a and 17b (only 17a is shown) are disposed on a mount 16 that is on the rear side of the base 15. A carriage 18 equipped with wheels rides on the rails 17a and 17b, and is centrally provided with a large hole through which a power supply column 19 is mounted on the carriage 18. Housed in the column 19 are a high voltage circuit 1 and a DC circuit 5. The position of the power supply column 19 on the carriage 18 can be adjusted by means of position adjusting means 20 which are provided between the carriage 18 and members 19c mounted to a side of the column 19. A connector 21 is provided with flanges 22, 22' at both ends. The power supply column 19 and the electron gun and accelerating tube column 13 are provided with flanges 19a and 13a, respectively. As shown in FIG. 2, the flanges 22, 22' are joined to the flanges 19a and 13a, respectively, using bolts (not shown). The apparatus is so assembled that; under this condition, the axis Y of the connector 21 is perpendicular to the axis Z of the evacuated microscope column 14, and that the carriage 18 moves on the rails 17a and 17b in the direction of the axis Y.

Figure 3:
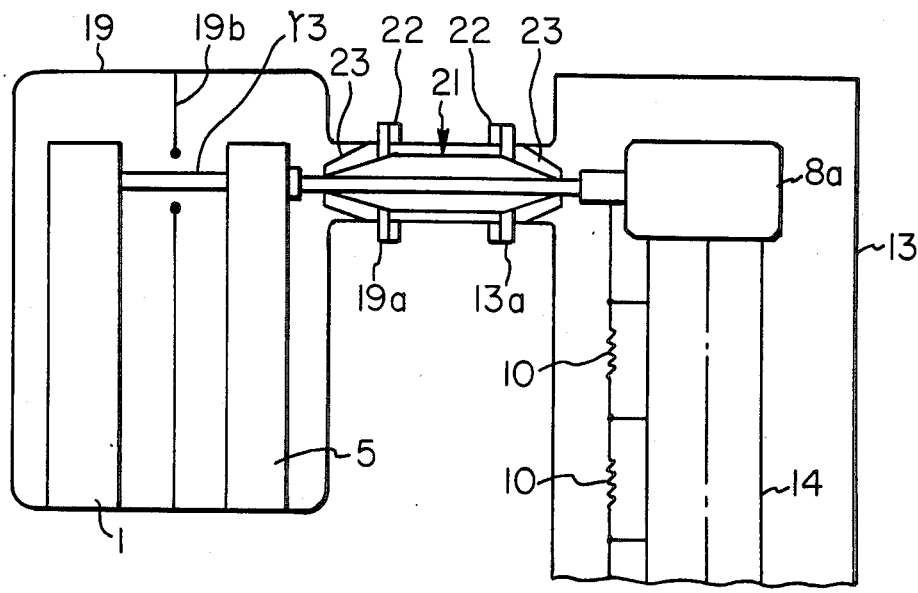
FIGS. 3 and 4 are cross-sectional views of main portions of the accelerator shown in FIG. 2.

FIG. 3 is a schematic cross section for showing the internal structures of the power supply column 19 and of the electron gun and accelerating tube column 13. It is to be noted that like components are indicated by like reference numerals throughout FIGS. 1-3. The inside of the power supply column 19 is partitioned into two chambers by a shielding plate 19b. The high voltage circuit 1 and the DC circuit 5 are housed in the two chambers, respectively. The shielding plate 19b is formed with a hole, through which a resistor $r_3$ forming the filtering circuit 3 is arranged. The high voltage circuit 1 is connected with the DC circuit 5 via the resistor $r_3$. A bushing 23 made from epoxy resin receives one end of the connector 21. This bushing 23 is attached to a portion of the power supply column 19 so as not to destroy the airtightness of the column 19. A second bushing 23' of similar structure is attached to the electron gun and accelerating tube column 13. Hence, the ends of the connector 21 are symmetrical in structure. The column 19 can be electrically connected with the column 13 by inserting the ends of the connector 21 into the bushings. The high voltage appearing across terminals formed on the end of the bushing 23' on the side of the electron gun and accelerating tube column 13 is applied to a structure 8a that supports the electron gun, and is also applied to the accelerating electrodes 11 in the microscope column 14 via the voltage-dividing resistors 10. The columns 13 and 19 are filled with the aforementioned insulating gas.

Figure 4:
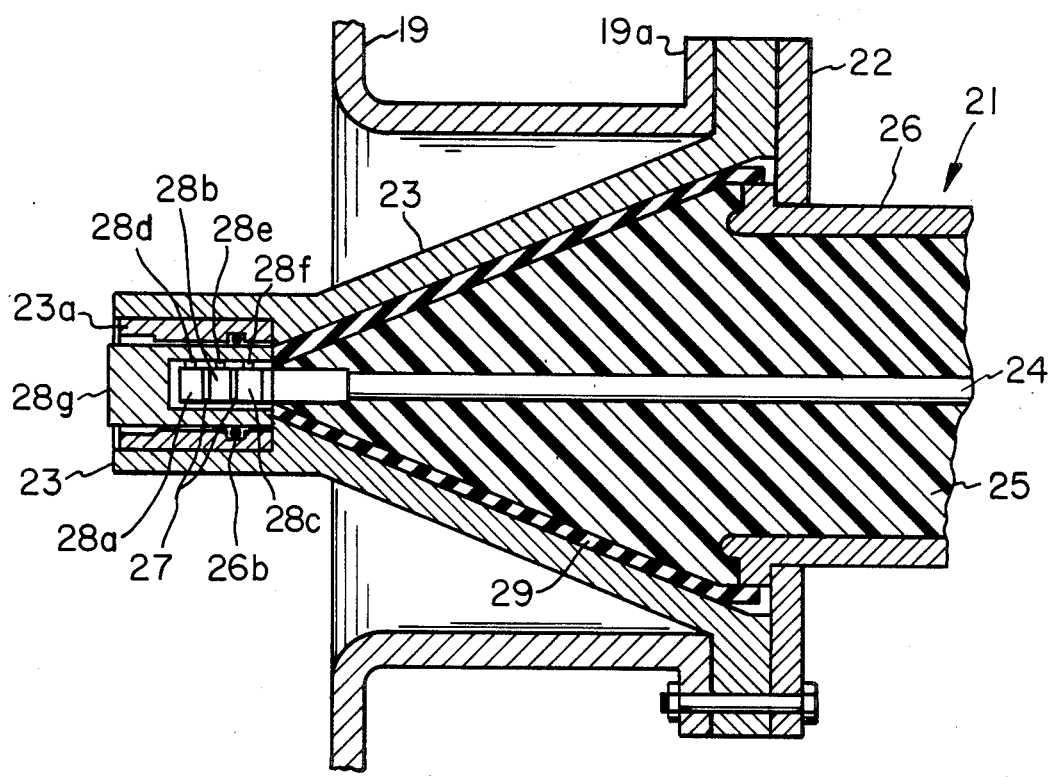

FIG. 4 is an enlarged cross section of the place where the connector 21 is connected to the power supply column 19. A pipe 24 made of copper extends axially through the connector 21, and is embedded in epoxy resin 25. Two conductors (not shown) extend through the pipe 24. The epoxy resin 25 is covered with a metal stress cylinder 26 that is maintained at ground potential. A flange 22 is mounted to the shown end of the cylinder 26 to tighten it. Terminals 28a, 28b, and 28c which are insulated from each other by insulators 27 are formed at the shown end of the pipe 24. These terminals are connected electrically to the terminals 28d, 28e and 28f of the terminal receiver 28g so as to transmit the electric current for heating the cathode as well as the potential at the control electrode. The terminal receiver 28g is turned into the pipe-shaped metal member 23a which is fixed to the end of the bushing 23. An O-ring recess is formed on the inner wall of the pipe-shaped member 23a for airtightness by providing the O-ring 26b between the pipe-shaped member 23a and the terminal receiver 28g. The end surface of the epoxy resin 25 is shaped into a conic form. The rate at which this conic portion tapers off is made equal to the rate at which the bushings 23, 23' taper off. In order to bring the conic portion of epoxy resin 25 into abutting engagement with the bushing 23, 23' without creating a gap between them and yet with a sufficient allowance. A cap 29 of highly elastic ethylenepropylene rubber is mounted on the conic portion, and insulating silicone grease is applied to the inner and outer surfaces of the cap 29. The surface pressure applied between the caps 29 and bushings 23, 23' can be appropriately adjusted by adjusting the degree of fastening made by the bolts which are join together the flanges 22, 22' and 19a or 13a.

In order to connect the power supply column 19 to the electron gun and accelerating tube column 13 by the connector 21 during the assembly of the apparatus described above, the column 19 and the carriage 18 are required to be previously matched with respect to height and horizontal position by manipulating the position-adjusting means 20 by the use of appropriate jigs or the like. However, once the positions have been adjusted, even if the connector 21 is discontinued from the columns later, the connector 21 can be easily connected to the columns without the need to readjust the positions. The structure constructed in this way permits the covers for the column 13 and 19 to be separately opened for cleaning or repair, thus greatly facilitating the maintenance of the apparatus. Additionally, the columns 13 and 19 are provided with valve or valves (not shown) so as to fill the insulating gas into the columns or leak the insulating gas in the columns for opening the columns. In checking the power supply circuit, the connector 21 is detached from the electron gun and accelerating tube column 13. Then, the power supply circuit can be quite conveniently checked using the terminals of the connector 21 while it is operating. In checking for possible breaking of the filament-like cathode in the electron gun, the connector 21 is disconnected from the power supply column 19. Then, the cathode can be easily checked using the terminals of the connector 21. Further, both ends of the connector 21 can be disconnected from the columns 13 and 19 while the insulating gas fills the columns. Consequently, the apparatus can be easily moved.

It is to be understood that the present invention is not limited to the electron microscope described above. For example, it may also be readily applied to an ion beam instrument.

What is claimed:

1. A charged-particle accelerator comprising:
a first hermetically tight column arranged to be evacuated;
a charged-particle source including source electrode and electrodes for accelerating the charged-particles along an axis within the first column;
a second hermetically sealed column arranged to be filled with an insulating
a power supply circuit within said second column;
a third hermetically sealed column arranged to be filled with an insulating gas and sealably mounted adjacent the first column and supporting electrical conductors to the source electrode in the first column;
said second column having a conical receptacle, said second column defining a conical surface, said conical surface having an elastomer layer thereover;
said third column having a conical receptacle, said third column defining a conical surface, said conical surface having an elastomer layer thereover;

a detachable rod connector with conical surfaces at each end for being abuttingly received in the conical receptacles of the second and third columns wherein the connector comprises a tube through which electrical conductors pass, an outer sheath and electrically insulating resin between the tube and sheath; and said rod connector having electrical conductors therein which plug into corresponding conductors in the first and second columns respectively.

2. A charged-particle beam accelerator according to claim 1, wherein the first and second columns are arranged for relative movement in the direction of the axis of the rod connector.

* * * * *

UNITED STATES PATENT AND TRADEMARK OFFICE
CERTIFICATE OF CORRECTION

PATENT NO. : 4,703,234

DATED : October 27, 1987

INVENTOR(S) : Shoji Kato

It is certified that error appears in the above-identified patent and that said Letters Patent is hereby corrected as shown below:

Column 1 Line 28 "reactor" should read --resistor--.

Column 4 Line 9 Delete --are--.

Claim 1 - Column 4 Line 55 After "insulating" insert --gas--.

Signed and Sealed this

Fifth Day of April, 1988

Attest:

DONALD J. QUIGG

Attesting Officer

Commissioner of Patents and Trademarks